US012666540B2

(12) United States Patent　(10) Patent No.:　US 12,666,540 B2
Wada et al.　(45) Date of Patent:　Jun. 23, 2026

(54) WIRING SUBSTRATE AND METHOD FOR MANUFACTURING THE SAME

(71) Applicant: IBIDEN CO., LTD., Ogaki (JP)

(72) Inventors: Kentaro Wada, Ogaki (JP); Koji Kondo, Ogaki (JP); Kenji Kunieda, Ogaki (JP); Masashi Umetsu, Ogaki (JP); Yuta Okaga, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 273 days.

(21) Appl. No.: 18/631,441

(22) Filed: Apr. 10, 2024

(65) Prior Publication Data

US 2024/0349430 A1　　Oct. 17, 2024

(30) Foreign Application Priority Data

Apr. 11, 2023　(JP) ................................. 2023-063937

(51) Int. Cl.
*H05K 3/00*　　　(2006.01)
*H05K 1/11*　　　(2006.01)
*H05K 3/18*　　　(2006.01)

(52) U.S. Cl.
CPC ........... *H05K 3/0094* (2013.01); *H05K 1/113* (2013.01); *H05K 3/181* (2013.01); *H05K 2203/072* (2013.01); *H05K 2203/0723* (2013.01)

(58) Field of Classification Search
CPC ...... H05K 1/113; H05K 1/116; H05K 3/0094; H05K 3/181; H05K 3/4611; H05K 3/4626; H05K 2203/072; H05K 2203/0723

USPC ........................................................ 174/250
See application file for complete search history.

(56) References Cited

U.S. PATENT DOCUMENTS

| 7,960,097 | B2 * | 6/2011 | Chau | ..................... H10P 76/202 |
| | | | | 430/311 |
| 11,388,822 | B2 * | 7/2022 | Chakraborty | .......... H05K 3/386 |
| 2024/0164019 | A1 * | 5/2024 | Yang | ..................... H05K 1/113 |

FOREIGN PATENT DOCUMENTS

JP　　　　2021-005646　　　1/2021

* cited by examiner

*Primary Examiner* — Timothy J Thompson
*Assistant Examiner* — Michael F Mcallister
(74) *Attorney, Agent, or Firm* — Finnegan, Henderson, Farabow, Garrett & Dunner, LLP

(57)　　　　　ABSTRACT

A wiring substrate includes insulating layers including a first insulating layer and a second insulating layer, conductive layers including a first conductive layer including a pad and a second conductive layer, a coating film covering the first conductive layer including the pad and improving adhesion between the first conductive layer and the second insulating layer, and a via conductor formed in a through hole penetrating through the second insulating layer and the coating film on the pad and connecting the pad and the second conductive layer. The pad has a surface formed such that a root mean square roughness of the surface is in a range of 0.10 μm to 0.23 μm, and a peeling part is formed between the pad and the second insulating layer such that the peeling part is formed within 15 μm around an outer edge of the through hole on the surface of the pad.

20 Claims, 5 Drawing Sheets

WIRING SUBSTRATE AND METHOD FOR MANUFACTURING THE SAME

CROSS-REFERENCE TO RELATED APPLICATIONS

The present application is based upon and claims the benefit of priority to Japanese Patent Application No. 2023-063937, filed Apr. 11, 2023, the entire contents of which are incorporated herein by reference.

BACKGROUND OF THE INVENTION

Field of the Invention

The present invention relates to a wiring substrate having a via conductor and a method for manufacturing the wiring substrate.

BACKGROUND OF THE INVENTION

Field of the Invention

Japanese Patent Application Laid-Open Publication No. 2021-5646 describes a wiring substrate in which a conductive layer is covered with a coating film between the conductive layer and an insulating layer thereon. The entire contents of this publication are incorporated herein by reference.

SUMMARY OF THE INVENTION

According to one aspect of the present invention, a wiring substrate includes insulating layers including a first insulating layer and a second insulating layer laminated on the first insulating layer, conductive layers including a first conductive layer formed on the first insulating layer and including a pad and a second conductive layer formed on the second insulating layer, a coating film formed on the first conductive layer such that the coating film is covering the first conductive layer including the pad and improving adhesion between the first conductive layer and the second insulating layer, and a via conductor formed in the second insulating layer such that the via conductor is formed in a through hole penetrating through the second insulating layer and the coating film formed on the pad and connecting the pad of the first conductive layer and the second conductive layer. The pad of the first conductive layer has a surface formed such that a root mean square roughness of the surface is in a range of 0.10 µm to 0.23 µm, and a peeling part is formed between the pad and the second insulating layer such that the peeling part is formed within 15 µm around an outer edge of the through hole on the surface of the pad.

According to another aspect of the present invention, a method for manufacturing a wiring substrate includes covering a first conductive layer including a pad with a coating film that improves adhesion between the first conductive layer and an insulating layer, forming the insulating layer such that the insulating layer covers the coating film and the first conductive layer, forming a through hole for a via conductor in the insulating layer such that the through hole penetrates through the insulating layer and the coating film and reaches a surface of the pad of the first conductive layer, and forming the via conductor in the through hole formed in the insulating layer and a second conductive layer on the insulating layer such that the via conductor connects the pad of the first conductive layer and the second conductive layer.

The forming the through hole includes forming a peeling part between the pad of the first conductive layer and the insulating layer such that the peeling part has a size formed within a range of 15 µm around an outer edge of the through hole on the surface of the pad of the first conductive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
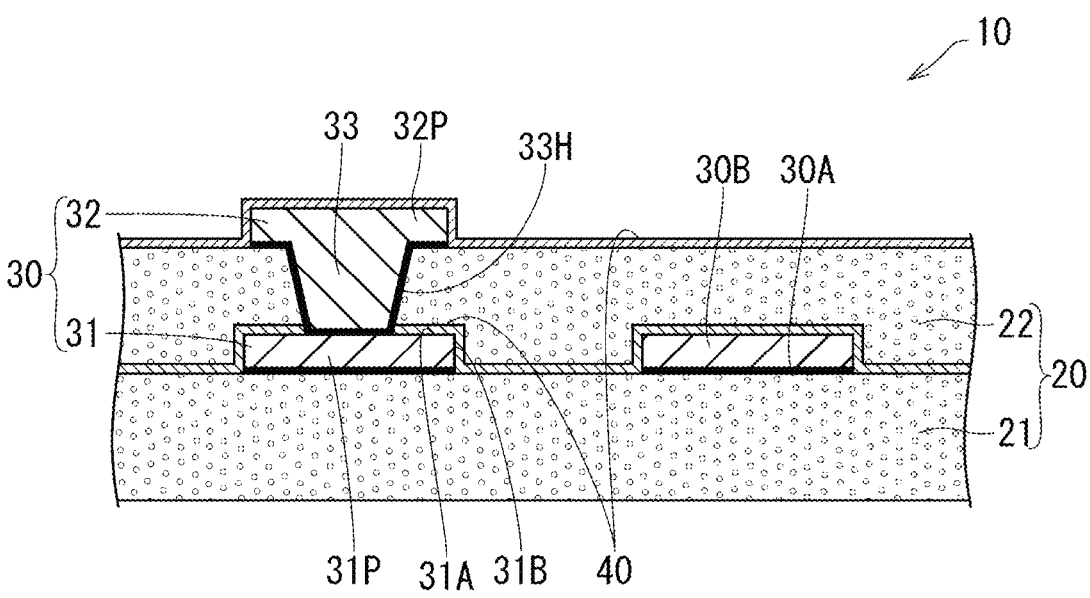
FIGS. 1A and 1B are cross-sectional views of a wiring substrate according to an embodiment of the present invention.

Embodiments will now be described with reference to the accompanying drawings, wherein like reference numerals designate corresponding or identical elements throughout the various drawings.

In the following, an embodiment of the present invention is described with reference to FIGS. 1A-5B. The wiring substrate 10 of the present embodiment is a multilayer laminated substrate in which multiple conductive layers 30 and multiple insulating layers 20 are alternately laminated on both sides of a core substrate, and a solder resist layer (not illustrated) is laminated on an outermost surface. FIG. 1A illustrates only two insulating layers 20 and two conductive layers 30 out of these layers. In the following, the lower insulating layer 20 in FIG. 1A is referred to as a first insulating layer 21, and the upper insulating layer 20 is referred to as a second insulating layer 22. Further, the conductive layers 30 are similarly referred to as a first conductive layer 31 and a second conductive layer 32.

The first conductive layer 31 and the second conductive layer 32 are, for example, copper plating layers, and are each formed of a conductor formed of an electroless plating layer (30A) and an electrolytic plating layer (30B). The first conductive layer 31 and the second conductive layer 32 include multiple pads (31P, 32P). In the second insulating layer 22, between the pads (31P, 32P) that overlap in a lamination direction, a via hole (33H) corresponding to a "through hole" of the claims is formed, and a via conductor 33 connecting the pads (31P, 32P) is formed in the via hole (33H). The multiple pads (31P, 32P) are each formed, for example, in a planar circular shape, and are formed such that a central axis of the via conductor 33, which is reduced in diameter downward, passes through centers of the pads (31P, 32P) (see FIG. 2).

The wiring substrate 10 of the present embodiment is a high-speed transmission substrate, and surface roughnesses of the conductive layers 30 including the first conductive layer 31 and second conductive layer 32 are, for example, about 0.05-0.2 μm in order to suppress an increase in impedance due to the skin effect. Further, in order to improve adhesion strength between the conductive layers 30 including the first conductive layer 31 and the second conductive layer 32, and the insulating layers 20 including the second insulating layer 22 laminated thereon, the conductive layers 30 are each covered with a coating film 40.

The coating film 40 is formed of a material that can bond to both the insulating layers 20 and the conductive layers 30, and for example, a silane coupling agent containing a silane compound is used. Further, the coating film 40 covers not only upper surfaces and side surfaces of the conductive layers 30, but also portions of the insulating layers 20 exposed from the conductive layers 30. Further, a thickness of the coating film 40 is substantially uniform, and is, for example, 0.02-0.5 μm.

The coating film 40 is provided on all the conductive layers 30. However, it is also possible that the coating film 40 is provided only on some of the conductive layers 30 (for example, only on the first conductive layer 31). Further, in FIG. 1A, in addition to the conductive layers 30, the portions of the insulating layers 20 exposed from the conductive layers 30 are also covered by the coating film 40. However, for example, it is also possible that only the surfaces (that is, the upper surfaces and side surfaces) of the conductive layers 30 are covered by the coating film 40. Further, the thickness of the coating film 40 may vary between the surfaces of the conductive layers 30 and the surfaces of the insulating layers 20.

Figure 4A:
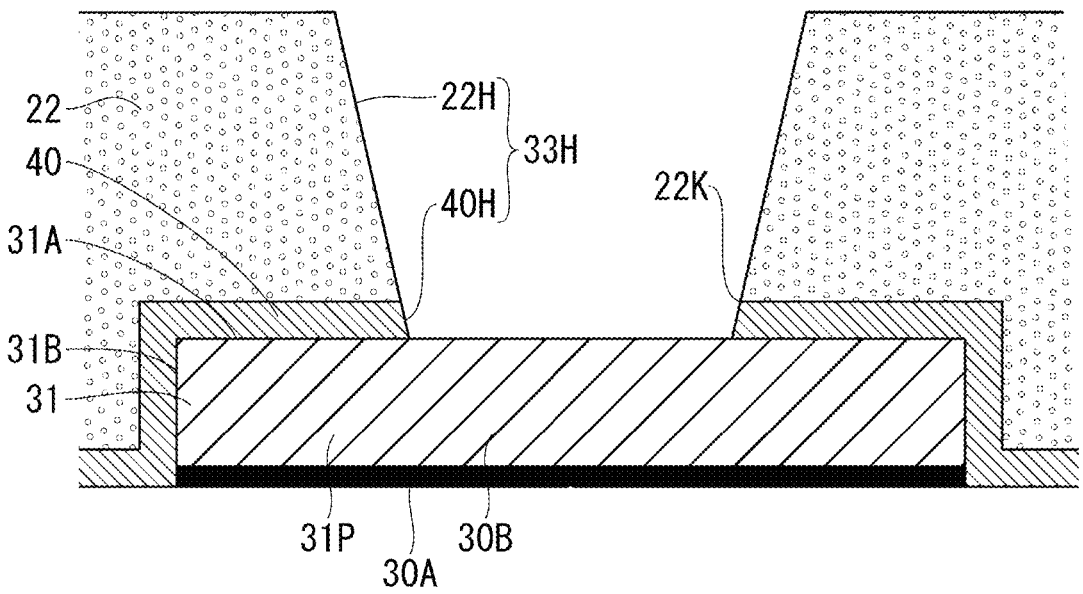
FIGS. 4A and 4B are cross-sectional views illustrating manufacturing processes of a wiring substrate according to an embodiment of the present invention.

However, a through hole (40H) for connecting to the via conductor 33 is formed in the coating film 40 on an upper surface (31A) of the pad (31P) (see FIG. 4A). Then, a peeling part 50 is formed starting from the through hole (40H).

Figure 1B:
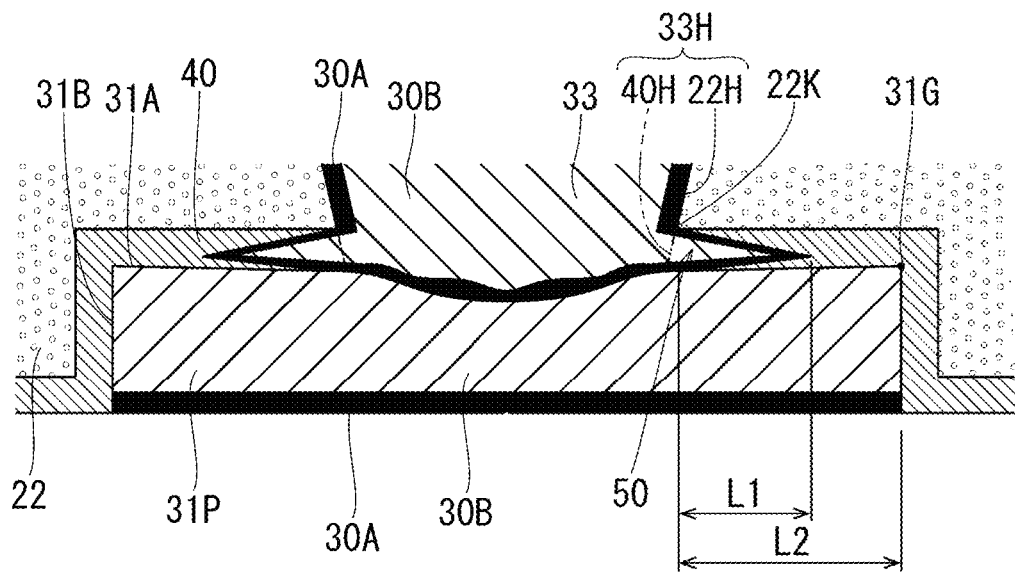
Figure 2:
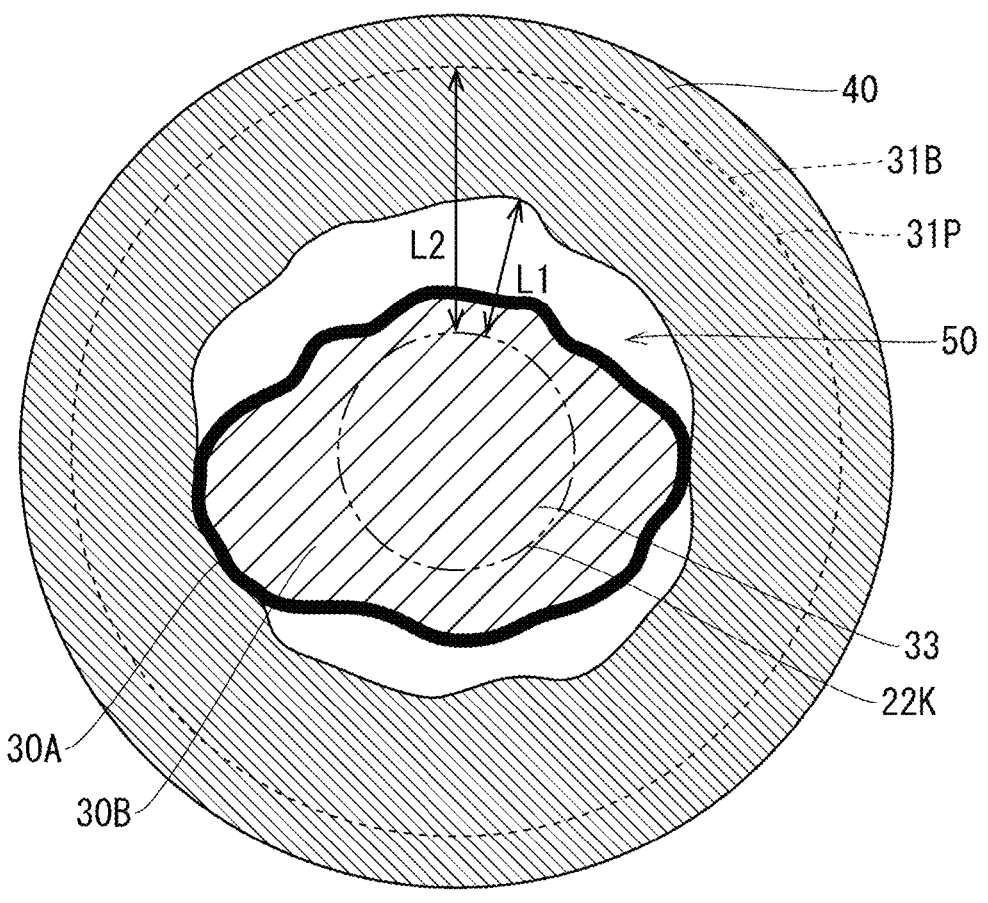
FIG. 2 is a plan cross-sectional view of a wiring substrate according to an embodiment of the present invention.

As illustrated in FIGS. 1B and 2, the peeled part 50 spreads between the upper surface (31A) of the pad (31P) and the second insulating layer 22 and has a substantially annular shape surrounding the via conductor 33. Specifically, the peeling part 50 has a width (L1) between a lower end part (specifically, a lower end opening edge (22K) of a through hole (22H) in the second insulating layer 22 as a part of the via hole (33H) for forming the via conductor 33, which corresponds to "an outer edge of a through hole" in the claims) and a front end part within a range of 15 μm (specifically, within a range of 5-15 μm, and preferably within a range of 5-10 μm). Further, a shortest distance (L2) from the lower end part (lower end opening edge (22K)) of the via conductor 33 to an outer edge of the upper surface (31A) of the pad (31P) is 15 μm or more. As a result, the peeling part 50 is contained within the upper surface (31A) of the pad (31P). In more detail, the maximum width (L1) of the peeling part 50 is kept, for example, in a range of 60% or less (preferably 50% or less) of the distance (L2) described above even at a widest portion.

The peeling part 50 is filled with the conductor (the electroless plating layer (30A) and the electrolytic plating layer (30B)) forming the via conductor 33. Specifically, as illustrated in FIG. 2, the peeling portion 50 is filled with the conductor so as to spread outward from an outer edge part of the via conductor 33, and in the example illustrated in FIG. 2, the conductor is filled up to the front end part of the peeling part 50 in a part of a circumferential direction.

The peeling part 50 may be formed between the upper surface (31A) of the pad (31P) and the second insulating layer 22. For example, the peeling part 50 may be formed along a boundary between the upper surface (31A) of the pad (31P) and the coating film 40, or along a boundary between the coating film 40 and the second insulating layer 22. Further, multiple peeling parts 50 may be formed in a thickness direction of the coating film 40.

It is also possible that the peeling part 50 is not filled with a conductor or is entirely filled with a conductor. Further, it is also possible that the conductor filled in the peeling part 50 is continuous with the conductor forming the via conductor 33, or, for example, is multiple granular conductors that are discontinuous with the conductor forming the via conductor 33. Further, a portion of the peeling part 50 that is not filled with the conductor may be a cavity, or, for example, may be filled with residues of the coating film 40.

The wiring substrate 10 according to an embodiment of the present invention is manufactured as follows.

Figure 3A:
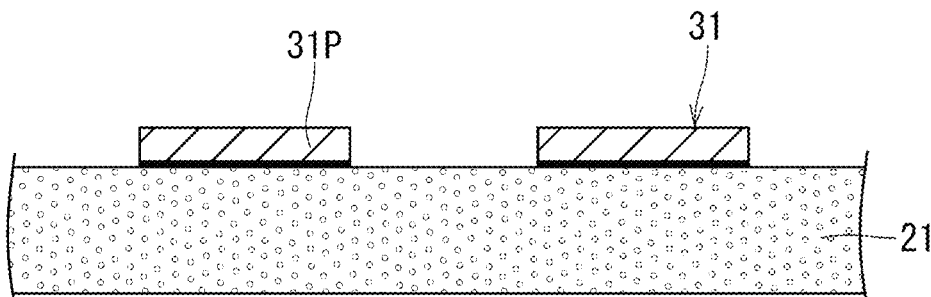
FIGS. 3A-3C are cross-sectional views illustrating manufacturing processes of a wiring substrate according to an embodiment of the present invention.

A core substrate (not illustrated) is prepared, and on conductive layers on both sides of the core substrate, the first insulating layer 21 may be laminated using a known method, and the first conductive layer 31 including the multiple pads (31P) is formed on the first insulating layer 21 (FIG. 3A). In this case, the surfaces (specifically, upper and side surfaces) of the first conductive layer 31 are not subjected to a roughening treatment or are subjected to a roughening treatment in which the surfaces are only slightly roughened. As a result, a root mean square roughness (Rq) of the surfaces of the first conductive layer 31 is 0.10 μm or more and 0.23 μm or less.

Figure 3B:
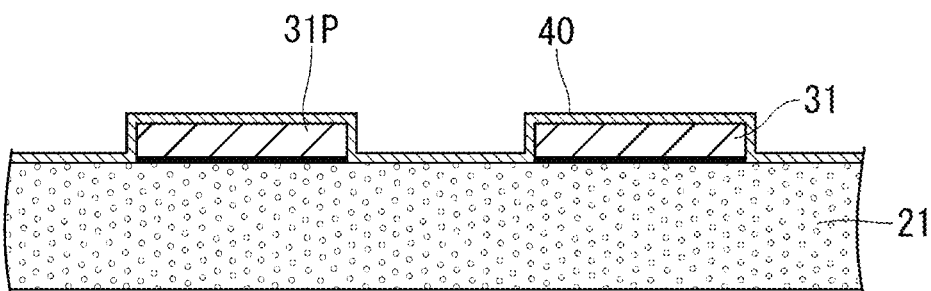

Next, as illustrated in FIG. 3B, the upper and side surfaces of the first conductive layer 31 and a portion of the first insulating layer 21 that is exposed from the first conductive layer 31 are covered by the coating film 40. In this case, the coating film 40 is formed substantially uniformly with a thickness of, for example, 0.02-0.5 μm or less.

Figure 3C:
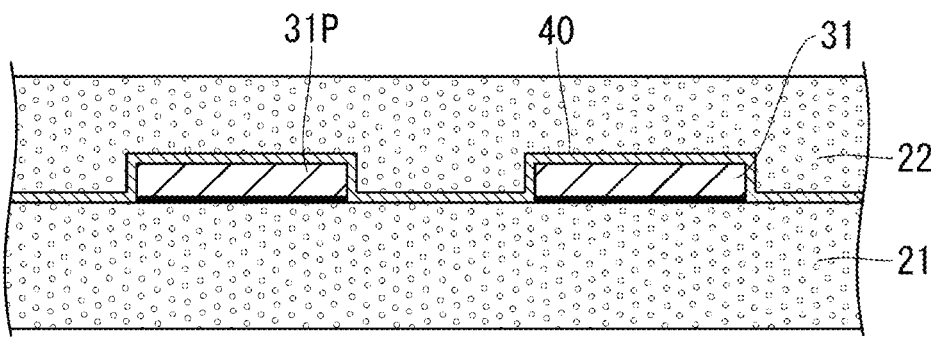

As illustrated in FIG. 3C, the second insulating layer 22 is laminated on the coating film 40. This increases adhesion strength between the first conductive layer 31 and the second insulating layer 22.

Figure 4B:
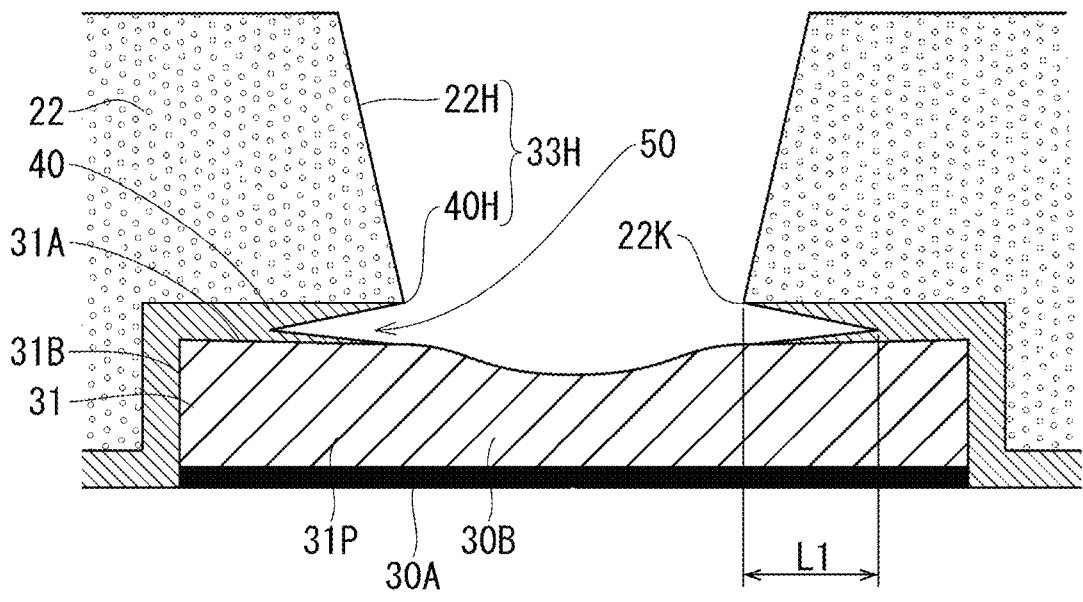

Next, by laser irradiation, the via hole (33H) is formed that penetrates the second insulating layer 22 and the coating film 40 on the upper surface (31A) of the pad (31P) (see FIG. 4A). A lower end part of the via hole (33H) is the through hole (40H) of the coating film 40 described above, and an upper side thereof is the through hole (22H) of the second insulating layer 22. In FIGS. 4A and 4B, only the pad (31P) portion of the first conductive layer 31 illustrated in FIG. 1A to which the via conductor 33 is connected is illustrated.

The via hole (33H) is cleaned (desmear treatment), and residues of the coating film 40 adhering to the upper surface (31A) of the pad (31P) are removed.

Soft etching is performed as a pretreatment of an electroless plating treatment. In this case, as illustrated in FIG. 4B, the coating film 40 dissolves from a surface of the through hole (40H), and the peeling part 50 is formed between the second insulating layer 22 and the pad (31P). Further, from the exposed upper surface (31A) of the pad (31P), the electrolytic plating layer (30B) dissolves, and a center portion of the upper surface (31A) slightly recesses. Here, in the present embodiment, the time of immersion or the number of immersions in a chemical solution or the concentration of the chemical solution is adjusted such that the width (L1) of the peeling part 50 from the lower end opening edge (22K) of the through hole (22H) in the second insulating layer 22 to the front end part is within 15 μm (specifically, within a range of 5-15 μm or less, preferably within a range of 5-10 μm or less).

Figure 5A:
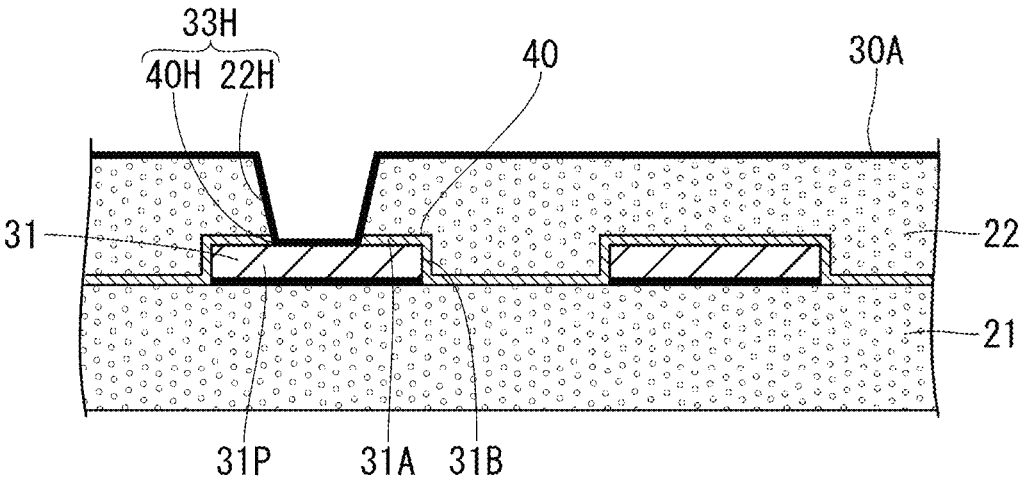
FIGS. 5A and 5B are cross-sectional views illustrating manufacturing processes of a wiring substrate according to an embodiment of the present invention.

Next, an electroless plating treatment is performed. Specifically, it is immersed in an electroless plating solution, and as illustrated in FIGS. 1B and 5A, the electroless plating layer (30A) is formed on an inner surface of the via hole (33H) and on a portion of the pad (31P) exposed from the coating film 40. Further, in this case, the electroless plating solution enters the peeling part 50, and the electroless plating layer (30A) is also formed in the peeling part 50 (see FIGS. 1B and 2).

To facilitate the formation of the electroless plating layer (30A) in the peeling part 50, for example, another pretreatment may be performed after the above-described soft etching, or the concentration of the chemical solution, the immersion time, or the number of immersions in the electroless plating treatment may be adjusted.

A plating resist 11 in a predetermined pattern is laminated on the electroless plating layer (30A).

Figure 5B:
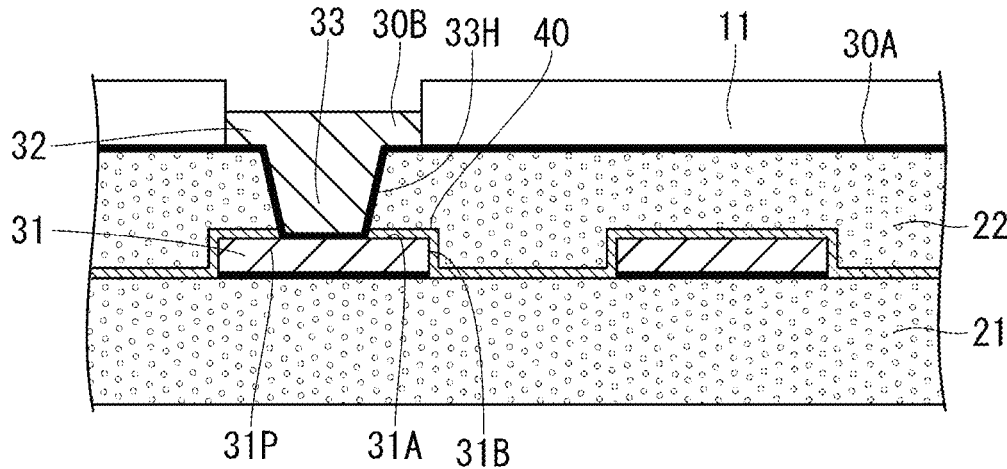

Next, an electrolytic plating treatment is performed, and as illustrated in FIG. 5B, the via conductor 33 is formed by filling the via hole (33H) with electrolytic plating, and the electrolytic plating layer (30B) is formed on a portion of the electroless plating layer (30A) exposed from the plating resist 11. Further, in this case, the electrolytic plating layer (30B) is formed on the electroless plating layer (30A) in the peeling part 50, and the peeling part 50 is filled with a conductor continuous with the conductor forming the via conductor 33 (see FIGS. 1B and 2).

To facilitate the formation of the electrolytic plating layer (30B) on the electroless plating layer (30A) in the peeling part 50, for example, the concentration of the chemical solution, the immersion time, or the number of immersions in the electrolytic plating treatment may be adjusted.

Next, the plating resist 11 is peeled off, and the electroless plating layer (30A) below the plating resist 11 is removed. Then, by the remaining electroless plating layer (30A) and electrolytic plating layer (30B), the second conductive layer 32 is formed (see FIG. 1A). Here, similar to the first conductive layer 31, surfaces of the second conductive layer 32 are not subjected to a roughening treatment or are subjected to a roughening treatment in which the surfaces are only slightly roughened, and a root mean square roughness (Rq) of the surfaces is 0.10 μm or more and 0.23 μm or less.

The processes described in FIGS. 3B to 5B above are repeated, and a solder resist layer is laminated on an outermost insulating layer 20. As a result, the wiring substrate 10 is completed.

The description about the structure and the manufacturing method of the wiring substrate 10 of the present embodiment is as given above. In this way, in the wiring substrate 10 of the present embodiment, since the peeling part 50 between the pad (31P) included in the first conductive layer 31 and the second insulating layer 22 thereon is contained within the upper surface (31A) of the pad (31P), adhesion strength between the pad (31P) and the second insulating layer 22 thereon is higher compared to a case where the peeling part 50 extends to a side surface (31B) of the pad (31P).

Further, in the present embodiment, not only is the peeling part 50 contained within the upper surface (31A) of the pad (31P), but also the width (L1) of the peeling part 50 is kept, for example, in a range of 60% or less (preferably 50% or less) of the shortest distance (L2) from the lower end part (lower end opening edge (22K)) of the via conductor 33 to an outer edge part of the upper surface (31A) of the pad (31P). Therefore, the adhesion strength between the pad (31P) and the second insulating layer 22 thereon can be further improved.

In addition, in the present embodiment, the peeling part 50 is filled with the conductor (the electroless plating layer (30A) and the electrolytic plating layer (30B)) forming the via conductor 33, and thus, conductivity between the pad (31P) and the via conductor 33 is stabilized.

Further, in the present embodiment, by setting the thickness of the coating film 40 to be 0.02-0.5 μm, the peeling part 50 between the pad (31P) and the second insulating layer 22 can be easily contained within a range of 15 μm or less around the via conductor 33 (the through hole (40H) of the coating film 40 or the lower end opening edge (22K)).

Other Embodiments

In the above embodiment, a conductive layer of a build-up layer is described as an example. However, without being limited to this, for example, the structure according to an embodiment of the present invention may also be applied to a conductive layer of a core substrate.

In the above embodiment, an example is given in which the width (L1) of the peeling part 50 at a widest portion is 60% or less of the distance (L2). However, without being limited to this, for example, it is also possible that an area of a largest portion of the peeling part 50 in the lamination direction is 60% or less (preferably, 50% or less) of an area of the upper surface (31A) of the pad (31P) excluding the lower end part of the via conductor 33. Further, it is also possible that, instead of the area of a portion where the peeling part 50 is the largest in the lamination direction, for example, an area of a boundary portion between the pad (31P) and the coating film 40, or an area of a boundary portion between the coating film 40 and the second insulating layer 22 is used.

In Japanese Patent Application Laid-Open Publication No. 2021-5646, in order to connect a via conductor that penetrates the insulating layer to a pad included in the conductive layer, a through hole is formed in the coating film on an upper surface of the pad. Then, starting from the through hole, a peeling part is formed between the insulating layer and the conductive layer, and the peeling part reaches from the upper surface to a side surface of the pad, resulting in a problem of reduced adhesion strength between the pad and the insulating layer thereon. Therefore, a wiring substrate according to an embodiment of the present invention has higher adhesion strength between a pad and an insulating layer thereon.

A wiring substrate according to one aspect of the present invention includes: a first insulating layer; a first conductive layer that is formed so as to partially cover an upper surface of the first insulating layer; a second insulating layer that is laminated on the first insulating layer with the first conductive layer sandwiched in between; a second conductive layer that is formed so as to partially cover an upper surface of the second insulating layer; a coating film that covers the first conductive layer in order to improve adhesion strength between the first conductive layer and the second insulating layer; and a via conductor for connecting a pad included in the first conductive layer and the second conductive layer, the via conductor being formed in a through hole penetrating the second insulating layer and the coating film on an upper surface of the pad. A root mean square roughness of the upper surface of the pad is 0.10 μm or more and 0.23 μm or less. A peeling part is formed between the pad and the second insulating layer. The peeling part is within 15 μm around an outer edge of the through hole on the upper surface of the pad.

Another aspect of the present invention is a method for manufacturing a wiring substrate in which a pad included in a first conductive layer below an insulating layer and a second conductive layer on the insulating layer are connected by a via conductor. The method includes covering the first conductive layer with a coating film in order to improve adhesion strength between the first conductive layer and the insulating layer, forming a through hole for forming the via conductor in the insulating layer and the coating film on an upper surface of the pad, forming the via conductor and the second conductive layer, and forming a peeling part between the pad and the insulating layer, with a size of the peeling part being contained within a range of 15 μm around an outer edge of the through hole on the upper surface of the pad.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
a plurality of insulating layers including a first insulating layer and a second insulating layer laminated on the first insulating layer;
a plurality of conductive layers including a first conductive layer formed on the first insulating layer and including a pad and a second conductive layer formed on the second insulating layer;
a coating film formed on the first conductive layer such that the coating film is covering the first conductive layer including the pad and improving adhesion between the first conductive layer and the second insulating layer; and
a via conductor formed in the second insulating layer such that the via conductor is formed in a through hole penetrating through the second insulating layer and the coating film formed on the pad and connecting the pad of the first conductive layer and the second conductive layer,
wherein the pad of the first conductive layer has a surface formed such that a root mean square roughness of the surface is in a range of 0.10 μm to 0.23 μm, and a peeling part is formed between the pad and the second insulating layer such that the peeling part is formed within 15 μm around an outer edge of the through hole on the surface of the pad.

2. The wiring substrate according to claim 1, wherein the coating film has a thickness in a range of 0.02 to 0.5 μm.

3. The wiring substrate according to claim 1, wherein the peeling part is formed within 60% of a distance from the outer edge of the through hole to an outer edge of the pad on the surface of the pad.

4. The wiring substrate according to claim 1, wherein the peeling part is filled with conductor material forming the via conductor.

5. The wiring substrate according to claim 2, wherein the peeling part is formed within 60% of a distance from the outer edge of the through hole to an outer edge of the pad on the surface of the pad.

6. The wiring substrate according to claim 2, wherein the peeling part is filled with conductor material forming the via conductor.

7. The wiring substrate according to claim 3, wherein the peeling part is filled with conductor material forming the via conductor.

8. The wiring substrate according to claim 5, wherein the peeling part is filled with conductor material forming the via conductor.

9. The wiring substrate according to claim 1, wherein the peeling part is formed within 50% of a distance from the outer edge of the through hole to an outer edge of the pad on the surface of the pad.

10. The wiring substrate according to claim 1, wherein the peeling part is formed between the pad of the first conductive layer and the insulating layer such that the peeling part has a size formed within a range of 5 μm to 15 μm around an outer edge of the through hole on the surface of the pad of the first conductive layer.

11. A method for manufacturing a wiring substrate, comprising:
covering a first conductive layer including a pad with a coating film that improves adhesion between the first conductive layer and an insulating layer;
forming the insulating layer such that the insulating layer covers the coating film and the first conductive layer;
forming a through hole for a via conductor in the insulating layer such that the through hole penetrates through the insulating layer and the coating film and reaches a surface of the pad of the first conductive layer; and
forming the via conductor in the through hole formed in the insulating layer and a second conductive layer on the insulating layer such that the via conductor connects the pad of the first conductive layer and the second conductive layer,
wherein the forming the through hole includes forming a peeling part between the pad of the first conductive layer and the insulating layer such that the peeling part has a size formed within a range of 15 μm around an outer edge of the through hole on the surface of the pad of the first conductive layer.

12. The method for manufacturing a wiring substrate according to claim 11, wherein the pad of the first conductive layer has a surface formed such that a root mean square roughness of the surface of the pad of the first conductive layer is in a range of 0.10 μm to 0.23 μm.

13. The method for manufacturing a wiring substrate according to claim 11, wherein the forming the coating film includes forming the coating film such that the coating film has a thickness in a range of 0.02 to 0.5 μm.

14. The method for manufacturing a wiring substrate according to claim 11, wherein the forming the via conductor and the second conductive layer includes filling the peeling part with conductor material forming the via conductor.

15. The method for manufacturing a wiring substrate according to claim 12, wherein the forming the coating film includes forming the coating film such that the coating film has a thickness in a range of 0.02 to 0.5 μm.

16. The method for manufacturing a wiring substrate according to claim 12, wherein the forming the via conductor and the second conductive layer includes filling the peeling part with conductor material forming the via conductor.

17. The method for manufacturing a wiring substrate according to claim 13, wherein the forming the via conductor and the second conductive layer includes filling the peeling part with conductor material forming the via conductor.

18. The method for manufacturing a wiring substrate according to claim 15, wherein the forming the via conductor and the second conductive layer includes filling the peeling part with conductor material forming the via conductor.

19. The method for manufacturing a wiring substrate according to claim 11, wherein the forming the through hole includes forming the peeling part between the pad of the first conductive layer and the insulating layer such that the peeling part has a size formed within a range of 5 $\mu$m to 15 $\mu$m around an outer edge of the through hole on the surface of the pad of the first conductive layer.

20. The method for manufacturing a wiring substrate according to claim 11, wherein the peeling part is formed within 60% of a distance from the outer edge of the through hole to an outer edge of the pad on the surface of the pad.

\* \* \* \* \*